(12) United States Patent
Teal et al.

(10) Patent No.: US 12,644,776 B2
(45) Date of Patent: Jun. 2, 2026

(54) METHOD FOR MAXIMIZING A BATTERY LIFE AND A TEMPERATURE MONITORING DEVICE HAVING THE SAME

(71) Applicant: ZEBRA TECHNOLOGIES CORPORATION, Lincolnshire, IL (US)

(72) Inventors: David C. Teal, Moorpark, CA (US); Christian S. Rothwell, North Kingstown, RI (US); Michael C. Wondolowski, Carpinteria, CA (US); Lisa M. Gabriel, Warwick, RI (US); Kenneth M. Stein, Newbury Park, CA (US)

(73) Assignee: Zebra Technologies Corporation, Lincolnshire, IL (US)

( * ) Notice: Subject to any disclaimer, the term of this patent is extended or adjusted under 35 U.S.C. 154(b) by 746 days.

(21) Appl. No.: 17/990,250

(22) Filed: Nov. 18, 2022

(65) Prior Publication Data

US 2024/0167886 A1 May 23, 2024

(51) Int. Cl.
G01K 1/02 (2021.01)
G01R 31/392 (2019.01)

(52) U.S. Cl.
CPC ........... G01K 1/026 (2013.01); G01R 31/392 (2019.01)

(58) Field of Classification Search
CPC ............... G01K 1/026; G01K 2207/04; G01K 2215/00; G01K 1/022; G01R 31/392

USPC .......................................................... 320/150
See application file for complete search history.

(56) References Cited

U.S. PATENT DOCUMENTS

| | | | |
|---|---|---|---|
| 2014/0240084 A1* | 8/2014 | Gropper | B65F 1/1607 |
| | | | 340/3.1 |
| 2016/0021223 A1* | 1/2016 | Choi | H04L 47/365 |
| | | | 370/428 |
| 2017/0239139 A1* | 8/2017 | Scully, Jr. | A61J 1/165 |
| 2019/0143915 A1* | 5/2019 | Lei | B60R 16/0232 |
| | | | 701/29.2 |
| 2021/0232531 A1* | 7/2021 | Patel | G06F 3/023 |
| 2021/0301868 A1* | 9/2021 | Galea | F16C 19/525 |
| 2022/0078595 A1* | 3/2022 | Wen | H04W 76/19 |
| 2022/0322244 A1* | 10/2022 | Cheng | H04W 40/10 |
| 2023/0325711 A1* | 10/2023 | Haraldson | G06N 3/084 |
| | | | 706/12 |

* cited by examiner

*Primary Examiner* — Huy Q Phan

(57) ABSTRACT

A method for maximizing a battery life and a temperature monitoring device are provided. The method includes detecting whether a low temperature mode is set in the temperature monitoring device; when the low temperature mode is detected, implementing a plurality of measures to enhance the battery life of the temperature monitoring device. The temperature monitoring device includes a memory, a button coupled with a light emitting diode unit, a battery and a processor. The temperature monitoring device is able to implement the method for maximizing life of the battery.

21 Claims, 4 Drawing Sheets

METHOD FOR MAXIMIZING A BATTERY LIFE AND A TEMPERATURE MONITORING DEVICE HAVING THE SAME

BACKGROUND

The quality and safety of many temperature-sensitive products such as pharmaceuticals, food products, chemicals, and biological products can be adversely affected by improper temperature control during processing, distribution, and storage. As a result, there are many circumstances where it may be necessary to process, ship, and/or store temperature-sensitive products in a low temperature environment. Monitoring the shipping process of food, medications, and other temperature-sensitive products in the low temperature environment has always been a challenge for suppliers and transportation companies. Various temperature monitoring devices have been developed to track the temperature during the process of shipping, distribution, and storage. To ensure that a desired thermal environment has been correctly monitored, there still exists a need to develop effective and efficient temperature monitoring devices that are cost friendly and can be particularly used in a low temperature environment for a desirable period of time.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
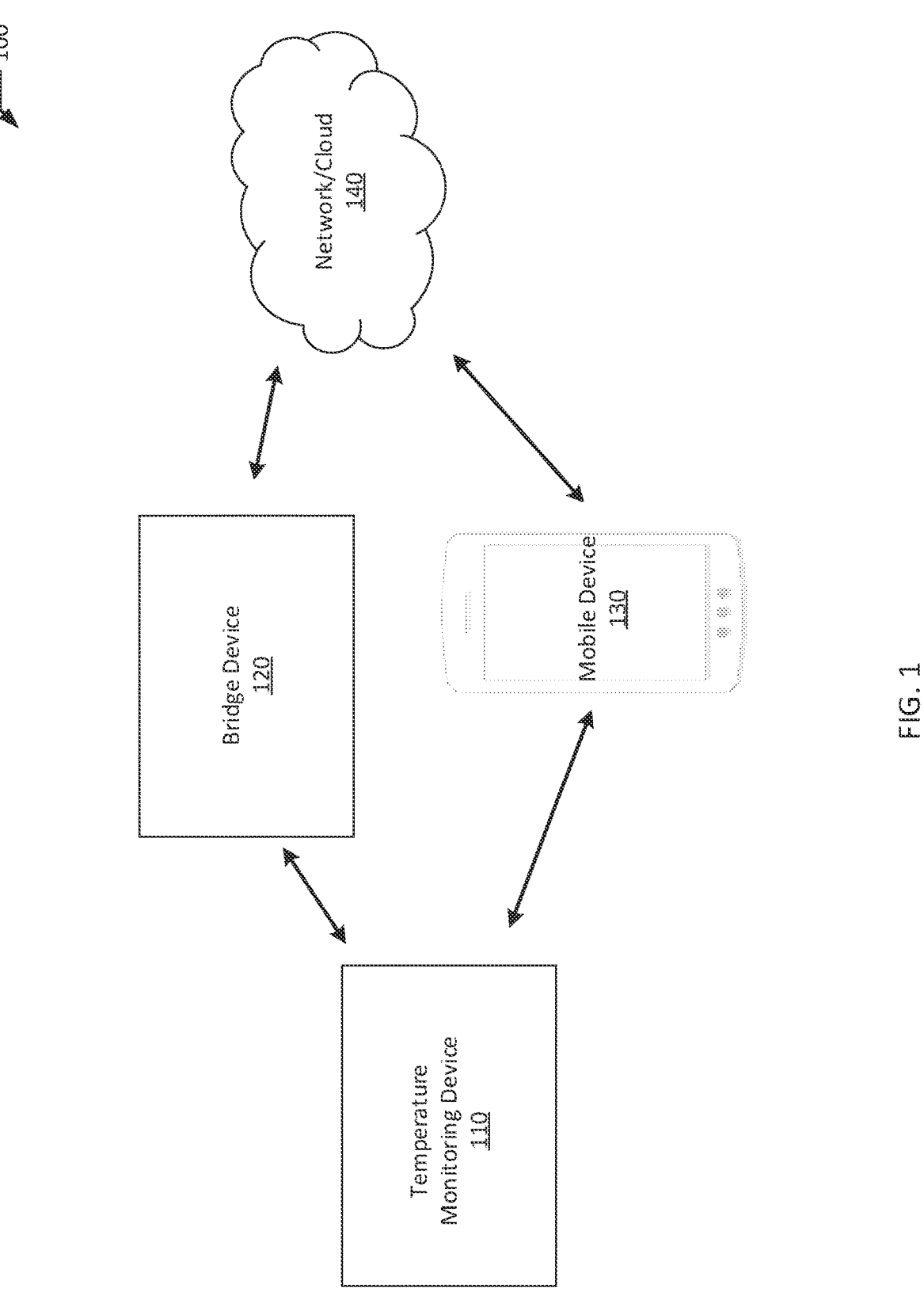
FIG. 1 is a diagram of a temperature monitoring system according to an embodiment of the present disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

The device and method components have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

DETAILED DESCRIPTION

As our world becomes more and more interconnected, the need to transport sensitive items long distances has become increasingly common. Many temperature-sensitive products such as pharmaceuticals, perishable food products, chemicals, and biological products require special care to process, ship, and/or store in a low temperature environment.

To ensure that a desired thermal environment has been maintained during the process, various temperature monitoring devices have been developed. Electronic temperature monitoring devices are examples that are commonly used for monitoring the temperature exposures of various products.

Electronic temperature monitoring devices are typically small portable devices that include instruments and memory for measuring and storing temperature readings. Electronic temperature monitoring devices, such as data loggers, can be used to monitor and record a variety of different environmental parameters. Electronic temperature monitoring devices including data loggers are small, battery-powered devices that may be equipped with a microprocessor, sensors, and a memory for storing data. Electronic temperature monitoring devices may be programmed to take specific measurements at desired time intervals. Electronic temperature monitoring devices can be used to create a more complete and accurate picture of any changes in environmental conditions.

The electronic temperature monitoring devices for use in a low temperature environment such as cold chain logistics need to operate in a wide temperature range from −40° C. to +85° C. At low temperatures (e.g., −20° C. or lower), the performance of the batteries in the electronic temperature monitoring devices may decrease drastically because there are issues on the ability of the batteries to maintain sufficient voltage and/or current when supplying a current pulse demanded by the electronic temperature monitoring devices. This decreased performance at low temperatures results in a significantly decreased operational life of the batteries which will cause issue to monitor the temperature exposures of various products.

In order to solve the technical problems described above, the present disclosure provides a temperature monitoring device capable of operating at a low temperature environment with a desirable period of time (e.g., acceptable battery life for fulfilling its intended purpose of the temperature monitoring device).

According to an embodiment of the present disclosure, a temperature monitoring device is provided. The temperature monitoring device includes a memory, a button coupled with a light emitting diode and a processor. The processor is configured to detect whether a low temperature mode is set in the temperature monitoring device. When the low temperature mode is not detected, the processor is configured to determine whether a current temperature of the temperature monitoring device is lower than a first reference temperature. If the current temperature of the temperature monitoring device is lower than the first reference temperature, the temperature monitoring device is configured to set up the low temperature mode. When the low temperature mode is detected, the processor is configured to implement a plurality of measures to enhance life of the battery of the temperature monitoring device.

In another embodiment, the present disclosure provides a method for maximizing a battery life of a temperature monitoring device that allows the temperature monitoring device being capable of operating at a low temperature environment (e.g., less than −25° C.) for a desirable period of time. The method comprises detecting whether a low temperature mode is set in the temperature monitoring device. When the low temperature mode is not detected, the method includes a step of determining whether a current temperature of the temperature monitoring device is lower than a first reference temperature. In case that the current temperature of the temperature monitoring device is lower than the first reference temperature, the method further comprising setting up the low temperature mode. When the low temperature mode is detected, the method includes a step of implementing a plurality of measures to enhance the battery life of the temperature monitoring device.

In yet another embodiment, the present disclosure provides a non-transitory machine-readable medium having codes stored thereon, when executed by a processor, cause the processor to detect whether a low temperature mode is set in a temperature monitoring device. When the low temperature mode is detected, implementing a plurality of measures to enhance the battery life of the temperature monitoring device.

The plurality of measures include measures to reduce peak current drawn from the battery during a current pulse and measures to increase recovery time between current pulses in order to enhance the battery life of the temperature monitoring device when the battery is in a low temperature (e.g., −25° C. to −40° C.).

The embodiments are described more fully herein after with reference to the accompanying drawings, in which some, but not all embodiments of the present technology are shown. Indeed, the present technology may be embodied in many different forms and should not be construed as limited to the embodiments set forth herein.

Likewise, many modifications and other embodiments of the vibration attenuation device and resonator for suppressing vibrations in piping systems described herein will come to mind to one of skill in the art to which the invention pertains having the benefit of the teachings presented in the foregoing descriptions and the associated drawings. Therefore, it is to be understood that the present disclosure is not to be limited to the specific embodiments disclosed and that modifications and other embodiments are intended to be included within the scope of the appended claims. Although specific terms are employed herein, they are used in a generic and descriptive sense only and not for purposes of limitation.

Throughout the specification and claims, terms may have nuanced meanings suggested or implied in context beyond an explicitly stated meaning. Likewise, the phrase "in an embodiment" as used herein does not necessarily refer to the same embodiment or implementation and the phrase "in another embodiment" as used herein does not necessarily refer to a different embodiment or implementation. It is intended, for example, that claimed subject matter includes combinations of exemplary embodiments or implementations in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" or "at least one" as used herein, depending at least in part upon context, may be used to describe any feature, structure, or characteristic in a singular sense or may be used to describe combinations of features, structures or characteristics in a plural sense. Similarly, terms, such as "a", "an", or "the", again, may be understood to convey a singular usage or to convey a plural usage, depending at least in part upon context. In addition, the term "based on" or "determined by" may be understood as not necessarily intended to convey an exclusive set of factors and may, instead, allow for existence of additional factors not necessarily expressly described, again, depending at least in part on context. In addition, the terms "about," "around" "approximately" and "substantially" are understood to refer to numbers in a range of numerals, for example the range of −10% to +10% of the referenced number, preferably −5% to +5% of the referenced number, more preferably −1% to +1% of the referenced number, most preferably −0.1% to +0.1% of the referenced number.

The terminology used herein is for the purpose of describing particular exemplary embodiments only and is not intended to be limiting. The terms "comprise", "comprises", "comprised" or "comprising", "including" or "having" and the like in the present specification and claims are used in an inclusive sense, that is to specify the presence of the stated features but not preclude the presence of additional or further features.

When an element, component or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

FIG. 1 illustrates a temperature monitoring system 100 according to an embodiment of the present disclosure. The system 100 may include one or more temperature monitoring devices 110. The temperature monitoring device 110 may be provided in a desirable place for monitoring the temperature exposures of various products. For example, the temperature monitoring device 110 may be placed in close proximity to the product being monitored. In another example, the temperature monitoring device 110 may be placed in a container where the product is also provided in the container. A bridge device 120 is communicatively coupled with the temperature monitoring device 110. In an example, the bridge device 120 may be wirelessly connected with the temperature monitoring device 110 via wireless communication protocols such as Bluetooth, Wi-Fi (Wireless Fidelity), Zigbee, Z-Wave, RFD (Radio-frequency identification), 5G or the like. In another example, the bridge device 120 may be connected with the temperature monitoring device 110 via a cable. The bridge device 120 may include a transceiver, an antenna, a processor, a memory or the like. The bridge device 120 is also coupled with a network server or a cloud platform 140. The temperature device 110 is able to receive and/or upload data and information to the network server or the cloud platform 140 via the bridge device 120. For example, the temperature device 110 is able to upload temperature data to the network server or the cloud platform 140 via the bridge device 120 and receive an update (e.g., a patch) over the air.

In another example, the temperature monitoring device 110 is also communicatively coupled with a mobile device 130. The temperature monitoring device 110 may communicate with the mobile device 130 through via wireless communication protocols such as Bluetooth, Wi-Fi (Wireless Fidelity), Zigbee, Z-Wave, NFC, 5G or the like. As illustrated in FIG. 1, the mobile device 130 is communicatively coupled to the network server or the cloud platform 140. Thus, the temperature monitoring device can also receive and/or upload data and information to the network server or the cloud platform 140 via the mobile device 130. A mobile application is stored and/or installed in the mobile device 130. Users can use the mobile application to control and/or change the setting and operations of the temperature monitoring device 110. The mobile application allows for greater automation capabilities to eliminate many manual operations of the temperature monitoring device 110.

Figure 2:
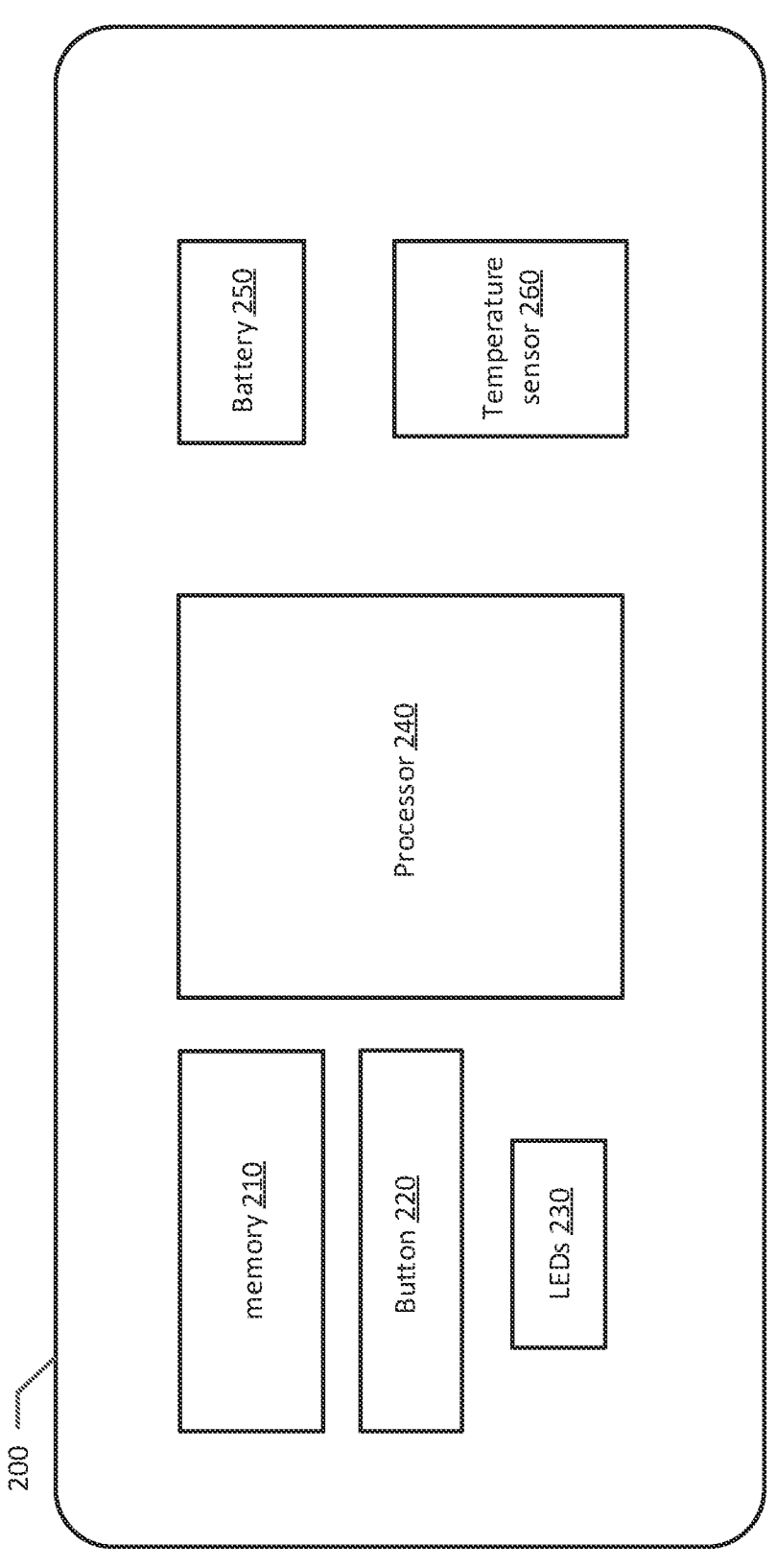
FIG. 2 is a diagram illustrating a configuration example of a temperature monitoring device according to an embodiment of the present disclosure.

Turning to FIG. 2, a configuration example of a temperature monitoring device 200 is illustrated according to an embodiment of the present disclosure. The temperature monitoring device 200 includes a processor 240, such as a central processing unit (CPU), application-specific integrated circuit (ASIC), or the like, communicatively coupled with a non-transitory computer-readable storage medium such as a memory 210. The memory 210 may include volatile memory elements (e.g., random access memory (RAM), non-volatile memory elements (e.g., flash memory or the like) or a combination of the volatile memory elements and the non-volatile memory elements. The memory 210 stores a plurality of computer-readable instructions in the form of applications, software and/or firmware whose execution by the processor 240 configures the temperature monitoring device 200 to perform the plurality of measures in the low temperature mode described herein. The temperature monitoring device 200 includes a button switch 220 coupled with a light emitting diode (LED) unit 230. The button switch 220 allows users to turn on and off certain functionalities such as Bluetooth advertising or connection, over the air (OTA) update, or maximum transmission unit (MTU) transmission. In another example, users can turn on and off the entire power of the temperature monitoring device 200.

The LED unit 230 may include one or more light emitting diodes. For example, the LED unit 230 may include 3 separate LEDs (e.g., red, yellow, and green) located close to each other. The LED unit 230 is able to light up, blink, or flash in different colors according to the status of the temperature monitoring device 200 and/or in response to an operation of press on the button switch 220. Button actuation may cause the LEDs to light up, blink or flash. In another example, the LEDs may light up, blink or flash without any button actuation or press at all.

The temperature monitoring device 200 further includes a battery unit 250 that includes one or more battery cells. The battery unit 250 may include at least one of a lithium laminate battery, a lithium coin cell battery, an alkaline battery, a magnesium battery or the like that supplies power to the temperature monitoring device 200. The temperature monitoring device 200 also includes at least one temperature sensor 260 to perform the temperature measurement of an environment, any target product or object. The temperature sensor 260 may include at least one of a thermistor, a resistance temperature detector, a thermocouple or a semiconductor-based temperature sensor. The temperature monitoring device 200 as disclosed in the present disclosure is capable of operating in a wide range of temperature such as from −40° C. to 85° C.

Figure 3:
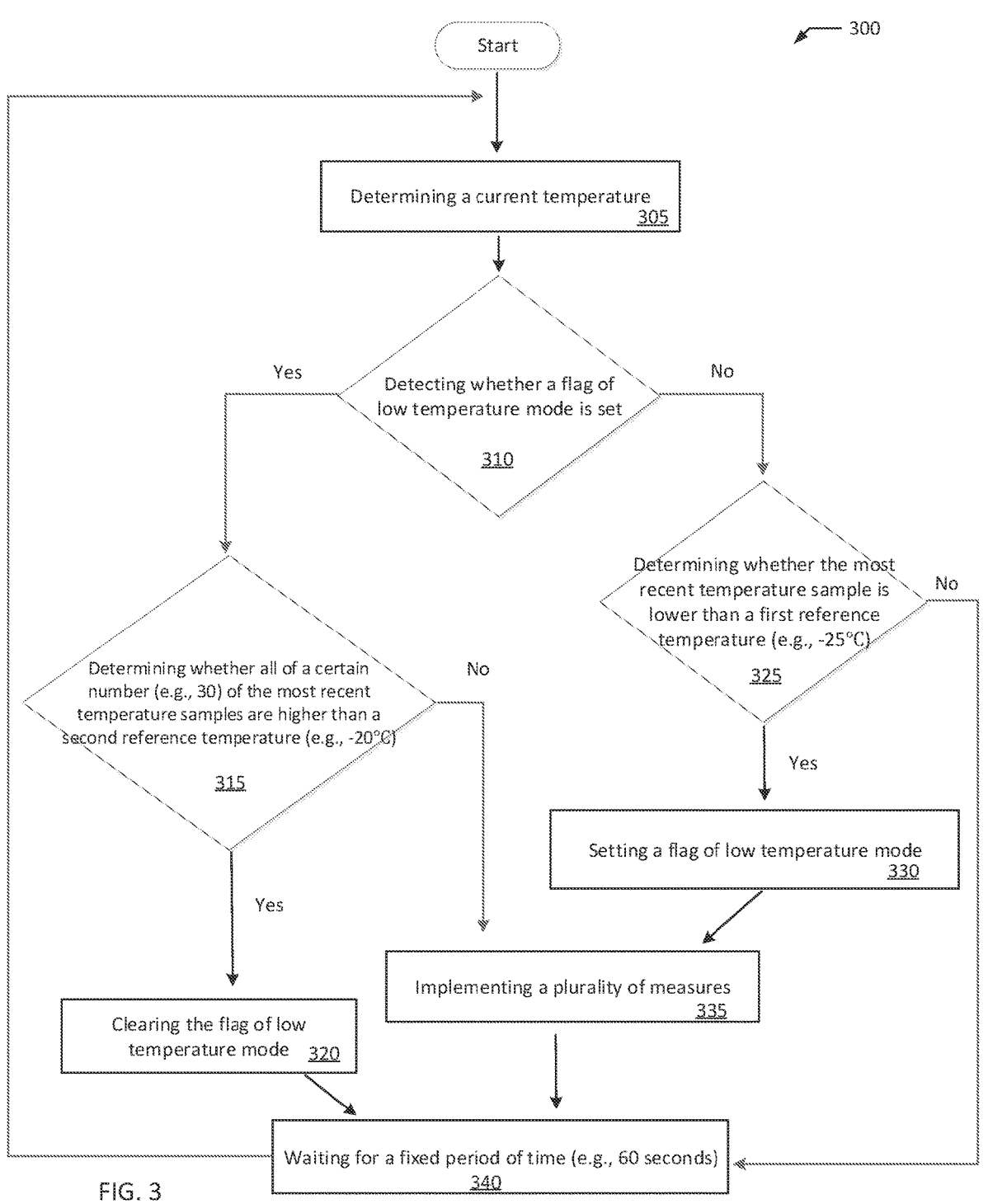
FIG. 3 is a flowchart of a method for maximizing a battery life of a temperature monitoring device according to an embodiment of the present disclosure.

FIG. 3 illustrates a flowchart of a method 300 for maximizing a battery life of a temperature monitoring device according to an embodiment of the present disclosure. The method 300 is described below in conjunction with its example performance in the system 100, by the temperature monitoring device 110.

At block 305, the temperature monitoring device 110 is configured to determine a current temperature of an environment where the temperature monitoring device 110 is provided in by using the temperature sensor 260 is illustrated in FIG. 2. The temperature sensor 260 may read a temperature sample in a predetermined frequency. For example, the temperature sensor 260 may wait for a fixed period of time (e.g., 60 seconds) before next temperature reading. The temperature monitoring device 110 is configured to detect whether a flag of a low temperature mode is set at block 310. The low temperature mode is a mode where the temperature monitoring device 110 is placed in certain temperature ranges (e.g., −40° C. to −25° C. or the like) and/or the temperature monitoring device 110 has limited or restricted functionality. The flag of the low temperature mode is, for example, a variable having a value of truth or false. If the value is truth, it means a flag of the low temperature mode is set. On the other hand, if the value is false, it indicates a flag of the low temperature mode is not set or is not in an active status in the temperature monitoring device 200. The processor 240 of the temperature monitoring device 200 is configured to read the variable and determine whether the flag of the low temperature mode is set or not.

According to an embodiment, when the flag of the low temperature mode is not set or is not in an active status, the temperature monitoring device 200 will determine whether the most recent temperature sample read or measured by the temperature sensor 260 is lower than a first reference temperature (e.g., −25° C.). If the most recent temperature sample is lower than the first reference temperature, then the temperature monitoring device 200 will set a flag of low temperature mode, and implement a plurality of measures that enhance and/or maximize life of the battery 250 as illustrated in FIG. 2. The plurality of measures, for example, include measures to reduce peak current drawn from the battery during a current pulse and/or measures to increase recovery time between current pulses in order to enhance the battery life of the temperature monitoring device. However, if the most recent temperature sample is equal to or higher than the first reference temperature, the temperature monitoring device 200 will not set a flag of low temperature mode, and the temperature monitoring device 200 will allow the temperature sensor 260 to wait for a fixed period of time (e.g., 60 seconds) before next temperature sampling.

Referring back to block 310, when the temperature monitoring device 200 detects that a flag of low temperature mode is set or is in an active statue (e.g., the value of the variable is true), the temperature monitoring device 200 will implement a plurality of measures that enhance and/or maximize life of the battery 250 at block 335. The temperature monitoring device 300 may determine whether all of a certain number (e.g., 30) of the most recent temperature samples are higher than a second reference temperature (e.g., −20° C.) before implementing a plurality of measures in an embodiment. For example, if one or more temperature samples of the certain number of the most recent temperature samples is equal to or lower than the second reference temperature, then the temperature monitoring device 200 will implement a plurality of measures that enhance and/or maximize life of the battery 250 at block 335. On the other hand, if all of the certain number of the most recent temperature samples are higher than the second reference temperature, then the temperature monitoring device 200 will clear the flag of low temperature mode (e.g., change the value from true to false) as illustrated in block 320 of FIG. 3. It should be understood that the second reference temperature may be higher than the first reference temperature in an embodiment. However, the second reference temperature may be equal to or lower than the first reference temperature in another embodiment if desirable.

As a non-limiting example, when the temperature monitoring device 200 has 30 or more temperature sample data storing in the memory 210, the temperature monitoring device 200 may read out the most recent 30 temperature sample data, and compares all the most recent 30 temperature sample data with a second reference temperature such as −20° C. If all of the most recent 30 temperature sample data are higher than −20° C., the temperature monitoring device 200 will recognize there is no need to hold itself in the low temperature mode and can automatically clear the flag of low temperature mode to resume the device to full functionality. After the flag of low temperature mode is cleared out, the temperature monitoring device 200 may allow the temperature sensor 260 to wait for a fixed period of time (e.g., 60 seconds) before next temperature sampling.

According to an embodiment of the present disclosure, when a low temperature mode flag is not set, the temperature monitoring device may take actions to ensure the current temperature is read or sampled at least once every certain seconds (e.g., once every 60 seconds, once every 120 seconds, or the like). For example, this can be from an active task or from a delayed start task that is sampling temperature. If a temperature reading is not taken for a period of time (such as 60 seconds), then the temperature monitoring device will issue command or instruction to ask the temperature sensor to perform a temperature read. If the current temperature read is lower than a predetermined reference temperature such as −25° C., then the temperature monitoring device will set a low temperature mode flag.

In another example, when a low temperature mode flag is not set, if the response to a command (e.g., Bluetooth command) requires to perform at least one of turning on a LED, uploading data (e.g., mission data) or receiving an Over-the-Air (OTA) update, then the temperature monitoring device will ask the temperature sensor to read or sample the current temperature, and determines whether the current temperature is less than a predetermined reference temperature (e.g., −25° C.) or not. If the current temperature is less than the predetermined reference temperature, then the temperature monitoring device will set a low temperature mode flag before taking any of these actions or tasks such as turning on a LED, uploading data (e.g., mission data) and receiving an Over-the-Air (OTA) update.

Still in another example, when a low temperature mode flag is not set, and the temperature monitoring device is waking from a sleep mode or the like (e.g., EM4 lowest possible energy consumption mode), then the temperature monitoring device will ask the temperature sensor to read or sample the current temperature, and determines whether the current temperature is less than a predetermined reference temperature (e.g., −25° C.) or not. If the current temperature is less than the predetermined reference temperature, then the temperature monitoring device will set a low temperature mode flag before performing at least one of flashing a LED or starting a Bluetooth advertising. Bluetooth advertising may allow the temperature monitoring device to broadcast information without connecting to another external device. Bluetooth advertising may also allow the temperature monitoring device to establish a bi-direction connection to other external devices such as a bridge device or a mobile device in another example.

Figure 4:
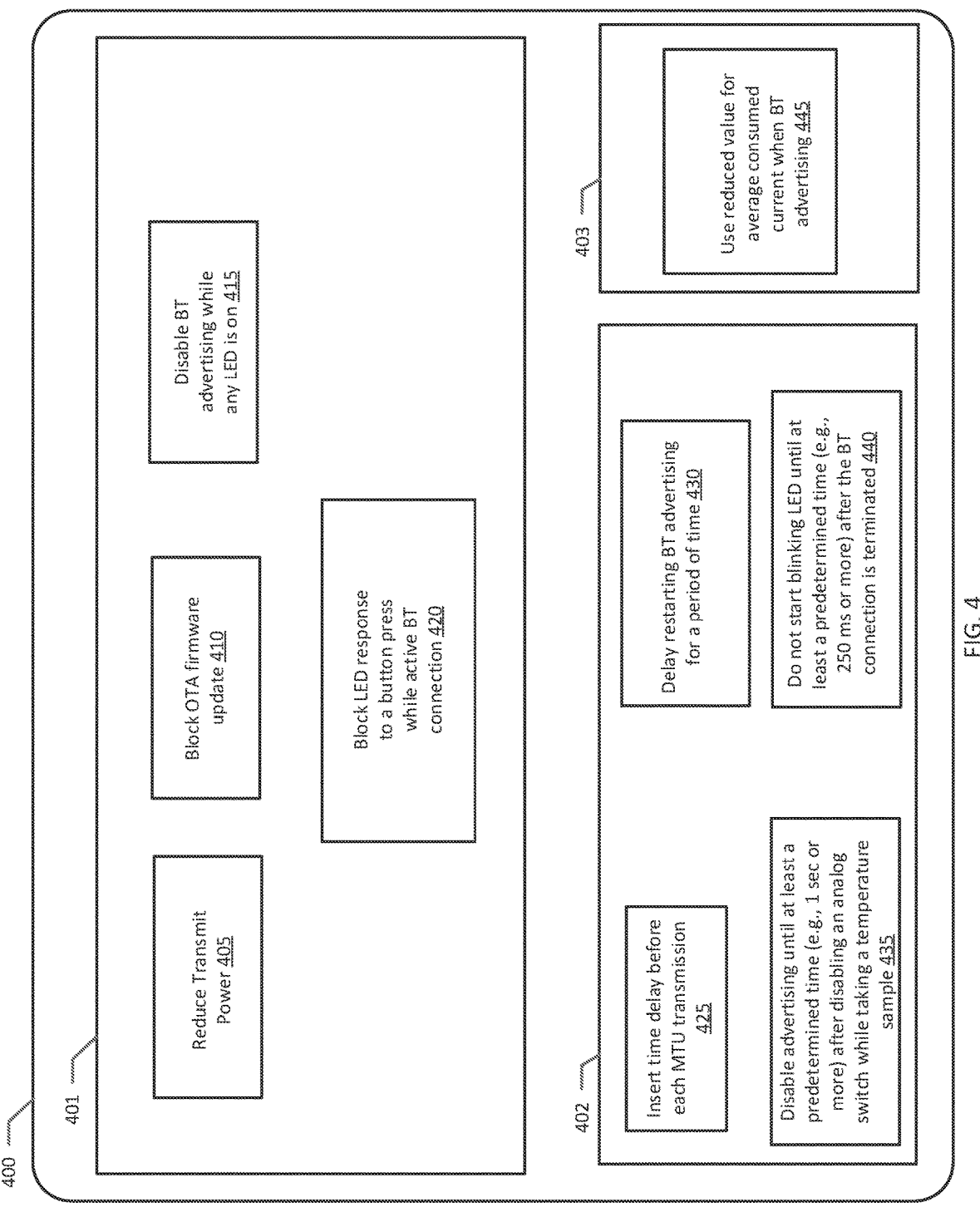
FIG. 4 is a diagram illustrating an example performance of block 335 in FIG. 3 according to an embodiment of the present disclosure.

As illustrated in FIG. 3, at block 335, one or more measures are implemented by the temperature monitoring device. The plurality of measures include measures to reduce peak current drawn from the battery during a current pulse at block 401 as illustrated in FIG. 4, measures to increase recovery time between current pulses at block 402 as illustrated in FIG. 4, and/or other measures at block 403 as illustrated in FIG. 5 in order to enhance the battery life of the temperature monitoring device when the battery is in a low temperature (e.g., −25° C. to −40° C.).

The measures for reducing peak current drawn from the battery may include, but not limited to, at least one of the following measures.

For example, when a low temperature mode is set or in active status, the temperature monitoring device is configured to reduce transmit power to a lower level (e.g., 0 dBm or less) as soon as possible as illustrated at block 405. However, if there is an active Bluetooth connection between the temperature monitoring device and another external device such as a bridge device or a mobile device, then the reducing power of transmission will be implemented after the Bluetooth connection is terminated.

The temperature monitoring device may also disable or block any attempt to perform OTA update as illustrated at block 410. Under circumstances, one or more LEDs may be turned on when button is pressed to wake the temperature monitoring device from EM4 mode or when the device is already awake. At least one of the LEDs may be turned on when the device receive a Bluetooth command to blink LEDs or start a mission. During the low temperature mode, the temperature monitoring device may take measures to disable a Bluetooth advertising while any LED is on as illustrated at block 415. If there is an active Bluetooth connection, the temperature monitoring device may block LED response to a button press or actuation as illustrated at block 420 in FIG. 4.

The measures for increasing recovery time between current pulses may include, but not limited to, at least one of the following measures.

For example, the temperature monitoring device may insert a delay time before each maximum transmission unit (MTU) transmission as illustrated at block 425. The delay time may be 50 ms, 100 ms, 200 ms or more. The temperature monitoring device may also delay restarting Bluetooth advertising for a period of time (e.g., 250 ms or more) after a Bluetooth connection is terminated as illustrated at block 430. In another example, the temperature monitoring device may disable a Bluetooth advertising for a period of time (e.g., 1 second or more) after disabling an analog switch (e.g., button) while the temperature sensor is taking a temperature sample as illustrated at block 435. In addition, the temperature monitoring device may insert a delay of blinking one or more LEDS for a period of time (e.g., 250 ms or more) after the Bluetooth connection is terminated as illustrated at block 440 in FIG. 4.

In the low temperature mode, the temperature monitoring device is also configured to adjust Coulomb Counting algorithm to calculate the battery capacity. For example, the temperature monitoring device may take measures to use a reduced or smaller value for average consumed current while performing a Bluetooth advertising in the low temperature mode as illustrated at block 445 in FIG. 4.

The temperature monitoring device is configured to automatically clear the flag of low temperature mode to resume the device to full functionality if temperature sampling data is higher than a reference temperature (e.g., −20° C.) for 30 or more consecutive temperature samplings. Temperature samplings may occur once every 60 seconds in an embodiment.

As mentioned above, at low temperatures, the performance of the batteries in the electronic temperature monitoring devices may decrease drastically because there are issues on the ability of the batteries to maintain sufficient voltage and current when supplying a current pulse demanded by the electronic temperature monitoring devices. For example, there are issues of operating the electronic temperature monitoring devices near −40° C. with a battery discharged to "end-of-life" conditions. To solve these issues, the present disclosure discloses a temperature monitoring device having a low temperature mode. When the temperature monitoring device is in the low temperature mode, certain functionalities are restricted or limited as compared to regular operation. For example, radio range may be reduced by approximately 50% or more. During regular operation, mission data upload time for 16K records is typically 6 to 9 seconds. However, in the low temperature mode, the mission data upload time may be increased slightly. For example, the increase may be 28 seconds or more but less than 60 seconds for 16K records. In addition, the Over-the Air (OTA) firmware updates may be blocked in the low temperature mode. In certain circumstances, there is no LED response to a button press if there is an active Bluetooth connection in the low temperature mode. In the low temperature mode, Bluetooth connection may take a few seconds longer to connect due to Bluetooth advertising being disabled when a temperature sample is in progress, or during LED activities, or Bluetooth advertising being disabled for a time of period (e.g., 250 ms) after a previous Bluetooth connection is terminated.

According to an embodiment, once the temperature monitoring device enters into the low temperature mode, returning back to regular operation or clearing the flag of the low temperature mode requires temperature sampling data is higher than a reference temperature (e.g., −20° C.) for 30 or more consecutive temperature samplings. Each temperature sampling is taken by the temperature sensor for at least every 60 seconds or more. The temperature monitoring device is configured to automatically clear the flag of low temperature mode when such condition is satisfied.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

It will be appreciated that some embodiments may be comprised of one or more specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A method for maximizing a battery life of a temperature monitoring device, the method comprising:
   detecting whether a low temperature mode is set in the temperature monitoring device; and
   when the low temperature mode is detected, implementing a plurality of measures to enhance the battery life of the temperature monitoring device,
   wherein the plurality of measures to enhance the battery life include at least one of:
   delay of a restart to the Bluetooth advertising after a Bluetooth connection is terminated; or
   delay of blinking a light emitting diode of the temperature monitoring device for a period of time after a Bluetooth connection is terminated.

2. The method of claim 1, when the low temperature mode is not detected, determining whether a current temperature of the temperature monitoring device is lower than a first reference temperature.

3. The method of claim 2, further comprising implementing the low temperature mode when the current temperature is less than the first reference temperature.

4. The method of claim 2, wherein the first reference temperature is −25° C.

5. The method of claim 1, wherein in response to a command to perform at least one of turning on a light emitting diode, uploading mission data, or receiving an over the air update,
   reading the current temperature of the temperature monitoring device; and determining whether the current temperature of the temperature monitoring device is less than the predetermined reference temperature.

6. The method of claim 5, further comprising setting the low temperature mode when determining that the current temperature of the temperature monitoring device is less than the predetermined reference temperature before performing the at least one of turning on the light emitting diode, uploading the mission data or receiving the over the air update.

7. The method of claim 1, wherein in response to waking from a sleep mode, reading the current temperature of the temperature monitoring device and determining whether the current temperature of the temperature monitoring device is less than a predetermined reference temperature.

8. The method of claim 7, further comprising setting the low temperature mode when determining that the current temperature of the temperature monitoring device is less than the predetermined reference temperature before performing at least one of flashing a light emitting diode or starting a Bluetooth advertising.

9. The method of claim 1, wherein the plurality of measures to enhance the battery life of the temperature monitoring device include reducing transmit power to a level after a Bluetooth connection is terminated.

10. The method of claim 9, wherein the level of transmit power is 0 dBm or less.

11. The method of claim 1, wherein the plurality of measures to enhance the battery life of the temperature monitoring device include inserting a delay time before each maximum transmission unit (MTU) transmission.

12. The method of claim 1, wherein the plurality of measures to enhance the battery life of the temperature monitoring device include disabling over the air update.

13. The method of claim 1, wherein the plurality of measures to enhance the battery life of the temperature monitoring device include disabling a Bluetooth advertising while a light emitting diode of the temperature monitoring device is on.

14. The method of claim 1, wherein the plurality of measures to enhance the battery life of the temperature monitoring device include disabling a Bluetooth advertising for a period of time after disabling an analog switch while taking a temperature sample.

15. The method of claim 1, wherein the plurality of measures to enhance the battery life of the temperature monitoring device include disabling a light emitting diode in response to a button switch press while a Bluetooth connection is active.

16. The method of claim 1, wherein the plurality of measures to enhance the battery life of the temperature monitoring device include using a reduced value for average consumed current while performing a Bluetooth advertising in the low temperature mode.

17. The method of claim 1, further comprising clearing the low temperature mode when all of a certain number of most recent temperature samples are higher than a second reference temperature.

18. A temperature monitoring device, comprising:
a memory;
a button coupled with a light emitting diode unit;

a battery; and
a processor configured to detect whether a low temperature mode is set in the temperature monitoring device,
when the low temperature mode is detected, the processor is configured to implement a plurality of measures to enhance the battery life of the temperature monitoring device,
wherein the plurality of measures configured to be implemented by the processor to enhance the battery life of the temperature monitoring device include:
delay of a restart to the Bluetooth advertising after a Bluetooth connection is terminated; or
delay of blinking a light emitting diode of the temperature monitoring device for a period of time after a Bluetooth connection is terminated.

19. The temperature monitoring device of claim 18, wherein the plurality of measures to enhance the battery life of the temperature monitoring device configured to be implemented by the processor include at least one of:
disabling a Bluetooth advertising while a light emitting diode of the temperature monitoring device is on;
disabling a Bluetooth advertising for a period of time after disabling an analog switch while taking a temperature sample;
disabling a light emitting diode in response to a button switch press while a Bluetooth connection is active; or
using a reduced value for average consumed current while performing a Bluetooth advertising in the low temperature mode.

20. A non-transitory machine-readable medium having code stored thereon, when executed by a processor, cause the processor to:
detect whether a low temperature mode is set in a temperature monitoring device,
when the low temperature mode is detected, implement a plurality of measures to enhance the battery life of the temperature monitoring device,
wherein the plurality of measures to enhance the battery life include at least one of:
delay of a restart to the Bluetooth advertising after a Bluetooth connection is terminated; or
delay of blinking a light emitting diode of the temperature monitoring device for a period of time after a Bluetooth connection is terminated.

21. The non-transitory machine-readable medium of claim 20, wherein the plurality of measures to enhance the battery life of the temperature monitoring device configured to be implemented when the processor executes the code include at least one of:
disabling a Bluetooth advertising while a light emitting diode of the temperature monitoring device is on;
disabling a Bluetooth advertising for a period of time after disabling an analog switch while taking a temperature sample;
disabling a light emitting diode in response to a button switch press while a Bluetooth connection is active; or
using a reduced value for average consumed current while performing a Bluetooth advertising in the low temperature mode.

* * * * *